United States Patent [19]
Jackson

[11] Patent Number: 5,442,352
[45] Date of Patent: Aug. 15, 1995

[54] LINEAR ATTENUATOR FOR CURRENT-MODE DIGITAL-TO-ANALOG CONVERTER (DAC) OR THE LIKE

[75] Inventor: H. Spence Jackson, Austin, Tex.

[73] Assignee: Motorola, Inc., Schaumburg, Ill.

[21] Appl. No.: 181,506

[22] Filed: Jan. 14, 1994

[51] Int. Cl.⁶ .............................................. H01P 1/22
[52] U.S. Cl. .................... 341/136; 333/81 R
[58] Field of Search .............. 341/133, 135, 136; 307/540, 550; 333/81 R; 327/309–313

[56] References Cited

U.S. PATENT DOCUMENTS

| | | | |
|---|---|---|---|
| 4,716,321 | 12/1987 | Erratico | 307/540 |
| 5,008,671 | 4/1991 | Tuthill | 341/136 |
| 5,032,801 | 7/1991 | Woo et al. | 333/81 R |
| 5,134,401 | 7/1992 | McCartney et al. | 341/143 |
| 5,293,166 | 3/1994 | Ta | 341/118 |
| 5,331,322 | 7/1994 | Cha et al. | 341/136 |
| 5,351,030 | 9/1994 | Kobayashi et al. | 338/295 |

Primary Examiner—Marc S. Hoff
Attorney, Agent, or Firm—Paul J. Polansky

[57] ABSTRACT

A linear attenuator (23) for applications such as front-/rear audio fading receives an input current to be programmably attenuated according to an input code at an input node (29). A transistor (30) is connected between the input node (29) and inputs of current-steering cells (40, 50, 60), which pass portions of the input current to either an output node (32) or a second node in response to the input code. An amplifier (22) has a negative input terminal connected to the input node (29), a positive input terminal receiving a reference voltage, and an output terminal connected to a control electrode of the transistor (30). The operational amplifier (22) and the transistor (30) together regulate the voltage at the input node (29) to prevent distortion of the input current by making the input node (29) a virtual ground node. Thus the attenuator (23) avoids nonlinearities normally associated with transistors and the need to duplicate a digital-to-analog converter (DAC) (21) providing the input current.

20 Claims, 2 Drawing Sheets

LINEAR ATTENUATOR FOR CURRENT-MODE DIGITAL-TO-ANALOG CONVERTER (DAC) OR THE LIKE

FIELD OF THE INVENTION

This invention relates generally to electrical circuits, and more particularly, to attenuators for digital-to-analog converters (DACs) or the like.

BACKGROUND OF THE INVENTION

Sigma-delta digital-to-analog converters (DACs) have gained wide popularity in integrated circuit design due to the high resolution and high linearity obtainable without the need for precise matching of on-chip components. The digital modulator shapes the quantization noise to be very low in the passband and much higher at out-of-band frequencies. The actual conversion to an analog signal is then performed by a very coarse DAC, which is typically implemented with a switched capacitor circuit or a current-mode DAC. In the latter case, an array of current sources, either binarily-weighted or monotonic, is switched relative to the code coming out of the digital modulator.

In the case where the full DAC function is used in a stereo audio application, there are typically four analog outputs that represent the final signals. The two stereo channels represent the left and right signals, but there is also a front and rear signal for both the left and right channels. If the front-to-rear fading is done in the digital domain, then the entire DAC function (i.e. the interpolation filter, the digital modulator, and the analog DAC) must be replicated twice for each channel resulting in four converters. This is very inefficient in terms of area and power consumption. If the fading can be done in the analog domain, only the final filter must be repeated four times, and a big savings in area and power in realized.

Implementing the fading function in the analog portion of the DAC, however, causes some difficult circuit design problems since the linearity of the modulator can be in the 95 decibel (dB) range. This means that the programmable gain function must not introduce any distortion that would degrade the overall converter performance. In the case of the current-mode DAC, several options are available to attenuate, or steer the signal current away from the output resulting in attenuation.

If the current-to-voltage conversion is performed with an operational amplifier and a feedback resistor, the attenuation can be performed by switching legs of a resistor to change the effective value. Unfortunately, in a complementary metal-oxide-semiconductor (CMOS) process, the switches are implemented with transistors, which have an 'on' resistance that varies with current and voltage. The size of transistor necessary to bring the distortion to an acceptable level then becomes prohibitive. If a current-steering circuit is used which implements saturated transistors to provide current division the problem then becomes the gate-to-source voltage ($V_{GS}$) modulation of the divider, which results in a drain-to-source voltage ($V_{DS}$) modulation of the current sources in the DAC. This creates distortion unless the output impedance of the DAC is extremely high, but then the issue of headroom comes into play.

Therefore, the present invention strives to overcome these problems resulting in an efficient solution to the problem of linear attenuation of the analog signal from a source such as a current-mode DAC.

SUMMARY OF THE INVENTION

Accordingly, the present invention provides, in one form, a linear attenuator for a current-mode digital-to-analog converter (DAC) or the like, including a first transistor, an amplifier, and a plurality of current-steering cells. The first transistor has a first current electrode for receiving an input current, a second current electrode, and a control electrode. The amplifier has a negative input terminal coupled to the first current electrode of the first transistor, a positive input terminal for receiving a reference voltage, and an output terminal coupled to the control electrode of the first transistor. Each of the plurality of current-steering cells is coupled to the second current electrode of the first transistor and receives a corresponding one of a plurality of input signals, and steers a current thereinto selectively to first and second nodes as determined by the corresponding one of the plurality of input signals. At least one of the first and second nodes forms an output terminal of the linear attenuator.

In another form, the present invention provides a digital-to-analog converter (DAC) with a linear attenuator, including a current DAC, an amplifier, and the linear attenuator. The current DAC has an output terminal for providing an output current. The amplifier has a negative input terminal coupled to the output terminal of the current DAC, a positive input terminal for receiving a reference voltage, and an output terminal. The linear attenuator includes a first transistor and a plurality of current-steering cells. The first transistor has a first current electrode coupled to the output terminal of the current DAC, a second current electrode, and a control electrode coupled to the output terminal of the amplifier. Each of the plurality of current-steering cells is coupled to the second current electrode of the first transistor and receives a corresponding one of a plurality of input signals, and steers a current thereinto selectively to first and second nodes as determined by the corresponding one of the plurality of input signals. At least one of the first and second nodes forms an output terminal of the linear attenuator.

These and other features and advantages will be more clearly understood from the following detailed description taken in conjunction with the accompanying drawings.

DETAILED DESCRIPTION OF A PREFERRED EMBODIMENT

Figure 1:
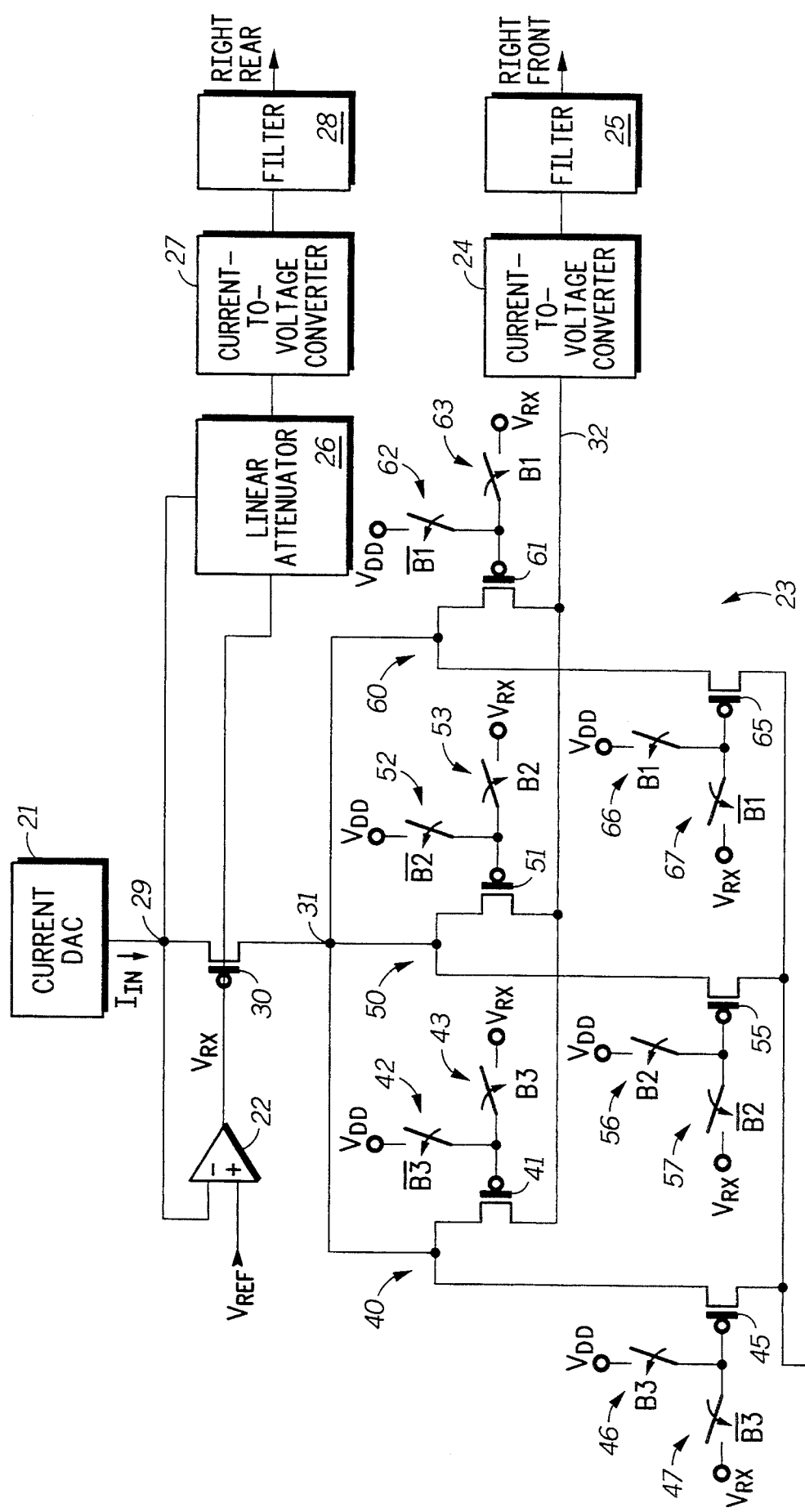
FIG. 1 illustrates in partial block diagram and partial schematic form a digital-to-analog converter (DAC) having a linear attenuator according to a first embodiment of the present invention.

FIG. 1 illustrates in partial block diagram and partial schematic form a digital-to-analog converter (DAC) 20 having a linear attenuator 23 according to a first embodiment of the present invention. DAC 20 includes generally a current DAC 21, an operational amplifier 22, linear attenuator 23, a current-to-voltage converter 24, a filter 25, a linear attenuator 26, a current-to-voltage converter 27, and a filter 28. Current DAC 21 provides a current signal labelled $I_{IN}$ to a node labelled 29. Amplifier 22 has a negative input terminal connected to node 29, a positive input terminal for receiving a reference voltage labelled "$V_{REF}$", and an output terminal for providing an output voltage labelled "$V_{RX}$". $V_{REF}$ is a stable reference voltage such as a voltage generated from a bandgap voltage reference circuit. Linear attenuator 23 is connected to node 29, to the output terminal of operational amplifier 22, and to an output node thereof labelled 32. Current-to-voltage converter 24 has an input terminal connected to node 32, and an output terminal. Filter 25 has an input terminal connected to the output terminal of current-to-voltage converter 24, and an output terminal for providing a first output signal labelled "RIGHT FRONT".

Linear attenuator 26 is connected to node 29, to the output terminal of operational amplifier 22, and to an output node thereof. Current-to-voltage converter 27 has an input terminal connected to the output node of linear attenuator 26, and an output terminal. Filter 28 has an input terminal connected to the output terminal of current-to-voltage converter 27, and an output terminal for providing a first output signal labelled "RIGHT REAR".

Linear attenuator 23 includes a P-channel metal-oxide-semiconductor (MOS) transistor 30, a first current-steering cell 40, a second current-steering cell 50, and a third current-steering cell 60. As used herein, the term "MOS transistor" refers to a polysilicon gate field effect transistor (FET), which is conventionally designated MOS having a polysilicon (rather than a metal) gate. Transistor 30 has a source connected to node 29, a gate connected to the output terminal of operational amplifier 22, and a drain connected to a node labelled 31. Current-steering cells 40, 50, and 60 are each connected to nodes 31 and 32, and selectively steer current between node 32 and a reference voltage terminal labelled "$V_{AG}$". $V_{AG}$ is an analog ground reference terminal having a voltage about halfway between the positive and negative potentials, or about 2.5 volts in a 5-volt system.

Current-steering cell 40 includes a P-channel MOS transistor 41, switches 42 and 43, a P-channel MOS transistor 45, and switches 46 and 47. Transistor 41 has a source connected to node 31, a gate, and a drain connected to node 32. Switch 42 has a first terminal connected to a power supply voltage labelled "$V_{DD}$", and a second terminal connected to the gate of transistor 41, and closes in response to the activation of a control signal labelled "$\overline{B3}$". $V_{DD}$ is a more-positive power supply voltage terminal having a nominal voltage of approximately 5 volts compared to a more-negative power supply voltage terminal. Switch 43 has a first terminal for receiving signal $V_{RX}$, and a second terminal connected to the gate of transistor 41, and closes in response to the activation of a control signal labelled "B3". Transistor 45 has a source connected to node 31, a gate, and a drain connected to $V_{AG}$. Switch 46 has a first terminal connected to $V_{DD}$, and a second terminal connected to the gate of transistor 45, and closes in response to the activation of signal B3. Switch 47 has a first terminal for receiving signal $V_{RX}$, and a second terminal connected to the gate of transistor 45, and closes in response to the activation of signal $\overline{B3}$.

Current-steering cell 50 includes a P-channel MOS transistor 51, switches 52 and 53, a P-channel MOS transistor 55, and switches 56 and 57. Transistor 51 has a source connected to node 31, a gate, and a drain connected to node 32. Switch 52 has a first terminal connected to $V_{DD}$, and a second terminal connected to the gate of transistor 51, and closes in response to the activation of a control signal labelled "$\overline{B2}$". Switch 53 has a first terminal for receiving signal $V_{RX}$, and a second terminal connected to the gate of transistor 51, and closes in response to the activation of a control signal labelled "B2". Transistor 55 has a source connected to node 31, a gate, and a drain connected to $V_{AG}$. Switch 56 has a first terminal connected to $V_{DD}$, and a second terminal connected to the gate of transistor 55, and closes in response to the activation of signal B2. Switch 57 has a first terminal for receiving signal $V_{RX}$, and a second terminal connected to the gate of transistor 55, and closes in response to the activation of signal $\overline{B2}$.

Current-steering cell 60 includes a P-channel MOS transistor 61, switches 62 and 63, a P-channel MOS transistor 65, and switches 66 and 67. Transistor 61 has a source connected to node 31, a gate, and a drain connected to node 32. Switch 62 has a first terminal connected to $V_{DD}$, and a second terminal connected to the gate of transistor 61, and closes in response to the activation of a control signal labelled "$\overline{B1}$". Switch 63 has a first terminal for receiving signal $V_{RX}$, and a second terminal connected to the gate of transistor 61, and closes in response to the activation of a control signal labelled "B1". Transistor 65 has a source connected to node 31, a gate, and a drain connected to $V_{AG}$. Switch 66 has a first terminal connected to $V_{DD}$, and a second terminal connected to the gate of transistor 65, and closes in response to the activation of signal B1. Switch 67 has a first terminal for receiving signal $V_{RX}$, and a second terminal connected to the gate of transistor 65, and closes in response to the activation of signal $\overline{B1}$.

FIG. 1 describes one channel (the right channel) of a stereo system with front/rear fading. Current DAC 21 outputs current signal $I_{IN}$, whose amplitude is proportional to a digital input signal. The resolution of current DAC 21 is not important, since with sigma delta converters, the overall performance is a function of both the analog DAC and the digital modulator. The current output from DAC 21, signal $I_{IN}$, is split equally between the front and rear paths, and each path has a linear attenuator which allows the front and rear attenuation to be programmed separately. Note that operational amplifier 22 provides signal $V_{RX}$ to both linear attenuators and thus is shared between the two, although it may be considered a part of each linear attenuator. After the linear attenuation function, the current is converted to a voltage and then filtered. The output of the filter is then the final analog signal.

Current DAC 21 is typically implemented with either a binarily-weighted array of current sources, or a monotonic array of equal-valued current sources. The current sources are usually implemented with P-channel devices due to noise issues, yet a mirror image of this system could also be implemented with N-channel sources. It is best if the current sources are cascoded, yet attenuator 23 alleviates the problem of finite output impedance in the current sources, so it is possible to use a non-cascoded current DAC where headroom may be an issue.

Ideally, current-to-voltage converters 24 and 27 are infinitely-low input impedance devices (virtual ground), with a voltage output. This function could be implemented with a simple resistor, yet the voltage variation on the bottom of the attenuator (node 32 for attenuator 23) would cause distortion. A more typical way of implementing this function is to use an operational amplifier with a resistor in feedback from the output to the negative input, and the positive input receiving an analog ground signal. The current is then fed into the negative input node and the transimpedance is then defined by the resistor. The filter would be a continuous-time structure. Both positive and negative feedback architectures are possible, but for linearity, the negative feedback structure is the preferred solution. The order of the filter is set by system level issues such as the order of the modulator, and the spurious, out-of-band noise specification.

As illustrated in FIG. 1, linear attenuator 23 is implemented with P-channel current dividers. The initial current division is performed by transistor 30. So, if there are two attenuators, and if transistor 30 and a transistor in attenuator 26 corresponding to transistor 30 are of equal size, then equal values of current from current DAC 21 will flow into each attenuator. The current is then fed into an array of current-steering cells, 40, 50, and 60, and the digital input code determines whether the current for a given steering cell will be directed to current-to-voltage converter 24, or to an analog ground node. As illustrated in FIG. 1, steering cells 40, 50, and 60 are binarily-weighted, so that the gate width-to-gate length ratio (W/L) of P-channel transistors 51 and 55 of cell 50 are twice that of transistors 61 and 65 of cell 60, and the W/L of transistors 41 and 45 in cell 40 are twice that of transistors 51 and 55 of cell 50, respectively. So, attenuator 23 is a three-bit divider circuit.

The operation of operational amplifier 22 serves to regulate the voltage at node 29 to direct-current (DC) reference voltage, $V_{REF}$. This effectively creates a virtual ground at node 29 which all but eliminates the modulation of the current sources in the current DAC 21. Operational amplifier 22 regulates node 29 by driving the gates of both transistor 30, and the transistors in each current-steering cell which are selected by the digital attenuation code. The transistor in each steering cell which is not being used is made nonconductive by pulling its gate to $V_{DD}$. The sizing of transistor 30 relative to the transistors in the current-steering cell must be such that the W/L of the steering transistor, which acts as a cascode device, must be sufficiently larger than the W/L of transistor 30, so that the $V_{GS}$ of the steering transistor, plus the drain-to-source saturation voltage ($V_{DSAT}$) of transistor 30, is smaller than the $V_{GS}$ of transistor 30.

A primary advantage of attenuator 23 is the regulation of output node 29 of current DAC 21. By controlling this node to a fixed voltage, there is no modulation of current DAC 21, and no distortion will result from the finite output impedance in the current sources which make up the DAC. By implementing the current division with saturated transistors, there are no effects associated with voltage-modulated transistors used as switches, operating in the triode region.

By driving the gates of the transistors in the attenuator with output signal $V_{RX}$ from operational amplifier 22, the transistors which implement the divider function are in the feedback loop of the virtual ground path. This also helps to ensure that varying current from current DAC 21, into attenuator 23 does not introduce distortion due to the non-linear nature of the voltage-to-current characteristics of an MOS transistor. In other words, the non-linear nature of the transistor is suppressed by the high gain of the operational amplifier 22. The performance of this circuit is ideally better than −100 dB of total harmonic distortion (THD).

The attenuator described above may be modified in various ways and still maintain high linearity. For example, a mirrored version of this circuit may be implemented with N-channel current sources in DAC 21. In that case the transistors in the linear attenuator would also be implemented with N-channel transistors. The number of current-steering cells may be increased or decreased according to the desired resolution needed in the programmable gain function. In addition, the current-steering cells may be implemented as a monotonic array of equally sized transistors so as to guarantee monotonically increasing attenuation with increasing input code for higher resolution programmable gain. The monotonic implementation would also require a binary-to-thermometer code converter to create the thermometer code which would drive the equally sized array of steering cells. In other embodiments, attenuator 23 could also be implemented with bipolar transistors in place of the illustrated P-channel transistors.

Figure 2:
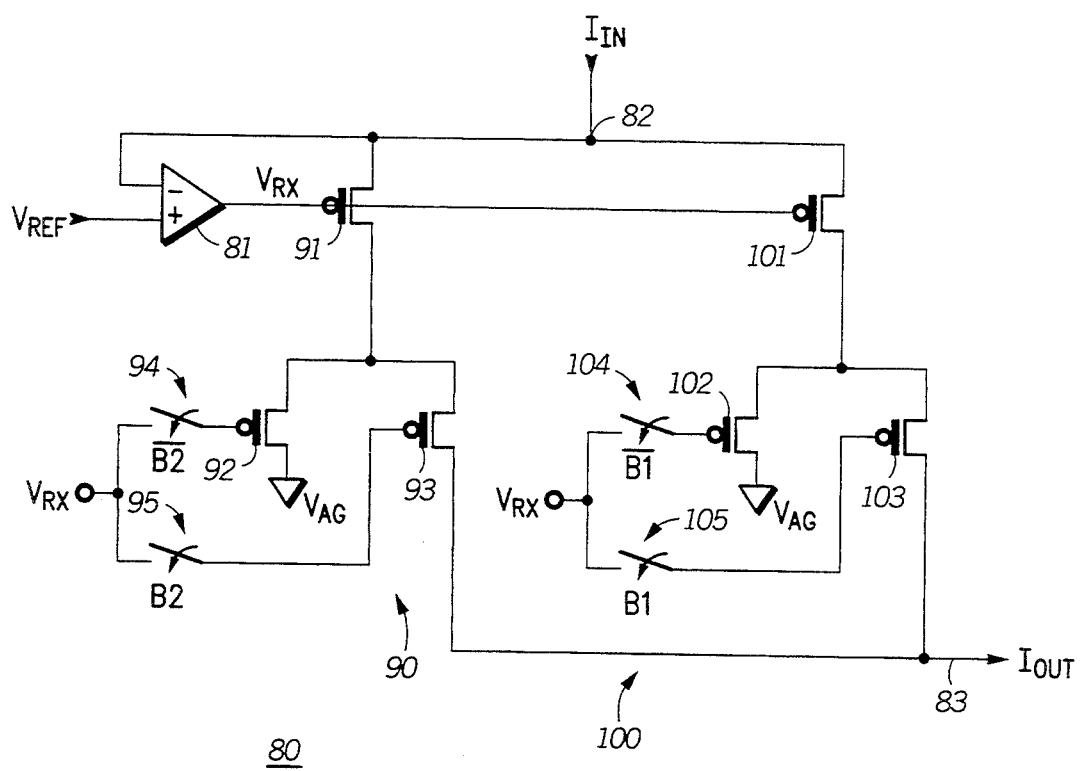
FIG. 2 illustrates in partial block diagram and partial schematic form a linear attenuator according to a second embodiment of the present invention.

FIG. 2 illustrates in partial block diagram and partial schematic form a linear attenuator 80 according to a second embodiment of the present invention. Signals analogous to those of FIG. 1 are similarly labelled in FIG. 2. Linear attenuator 80 includes generally an operational amplifier 81, an input node 82, an output node 83, a current-steering cell 90, and a current-steering cell 100. Operational amplifier 81 has a negative input terminal connected to node 82, a positive input terminal for receiving voltage $V_{REF}$, and an output terminal for providing an output signal thereof $V_{RX}$. Node 82 is an input node of linear attenuator 80 and receives current signal $I_{IN}$ thereon. Node 83 provides a current output signal labelled "$I_{OUT}$".

Current-steering cell 90 includes P-channel MOS transistors 91–93, and switches 94 and 95. Transistor 91 has a source connected to node 82, a gate for receiving signal $V_{RX}$, and a drain. Transistor 92 has a source connected to the drain of transistor 91, a gate, and a drain connected to $V_{AG}$. Transistor 93 has a source connected to the drain of transistor 91, a gate, and a drain connected to node 83. Switch 94 has a first terminal for receiving signal $V_{RX}$, and a second terminal connected to the gate of transistor 92, and closes in response to signal $\overline{B2}$. Switch 95 has a first terminal for receiving signal $V_{RX}$, and a second terminal connected to the gate of transistor 93, and closes in response to signal B2.

Current-steering cell 100 includes P-channel MOS transistors 101–103, and switches 104 and 105. Transistor 101 has a source connected to node 82, a gate for receiving signal $V_{RX}$, and a drain. Transistor 102 has a source connected to the drain of transistor 101, a gate, and a drain connected to $V_{AG}$. Transistor 103 has a source connected to the drain of transistor 101, a gate, and a drain connected to node 83. Switch 104 has a first terminal for receiving signal $V_{RX}$, and a second terminal connected to the gate of transistor 102, and closes in response to signal $\overline{B1}$. Switch 105 has a first terminal for receiving signal $V_{RX}$, and a second terminal connected to the gate of transistor 103, and closes in response to signal B1.

Attenuator 80 divides current $I_{IN}$ between current steering cells 90 and 100 based on the W/L ratio of transistors 91 and 101. The necessary W/L ratio between these transistors is determined by the significance of the corresponding bits of the input code. In the illustrated two-bit attenuator, therefore, transistor 91 has a W/L that is twice the W/L of transistor 101. Current in each current-steering cell is then selectively steered to either node 83, providing output current $I_{OUT}$, or to $V_{AG}$, based on the values of bits B1 and B2, respectively. Operational amplifier 81 again regulates the voltage at node 82 to $V_{RX}$ to provide a virtual ground at node 82. Thus, attenuator 80 retains the advantages of attenuator 23 of FIG. 1.

Attenuator 80, however, has an additional advantage over attenuator 23 of FIG. 1. Transistors 91 and 101 split current $I_{IN}$ between steering cells 90 and 100. Thus, transistors 91 and 101, rather than transistor pairs 92 and 93, and 102 and 103, are binarily-weighted according to the significance of the corresponding bit of the input code, bits B2 and B1, respectively. Dividing $I_{IN}$ in this way has the advantage that transistors 91 and 101 have a larger gate length (and thus can be better matched) than transistors 92, 93, 102, and 103. While attenuator 80 is appropriate for single-attenuator applications, attenuator 23 of FIG. 1 is still preferable in applications with separate attenuators for a single input current, such as front/rear attenuation illustrated in FIG. 1.

While the invention has been described in the context of a preferred embodiment, it will be apparent to those skilled in the art that the present invention may be modified in numerous ways and may assume many embodiments other than those specifically set out and described above. For example, current division may be performed either by appropriately-weighted transistors connected to the input node, or by appropriately-weighted transistors switched by the input code. Different transistor types such an N-channel MOS transistors, bipolar transistors, and the like may be used. An attenuator according to the present invention may be used with other sources of input current besides the illustrated current DAC. Also, the current-steering cells may steer current into either of two output nodes, rather than one output node and one ground node as in the illustrated embodiment. Accordingly, it is intended by the appended claims to cover all modifications of the invention which fall within the true spirit and scope of the invention.

I claim:

1. A linear attenuator for a current-mode digital-to-analog converter (DAC) or the like, comprising:
    a first transistor having a first current electrode for receiving an input current, a second current electrode, and a control electrode;
    an amplifier having a negative input terminal coupled to said first current electrode of said first transistor, a positive input terminal for receiving a reference voltage, and an output terminal coupled to said control electrode of said first transistor; and
    a plurality of current-steering cells each coupled to said second current electrode of said first transistor and receiving a corresponding one of a plurality of input signals, and steering a current thereinto selectively to first and second nodes as determined by said corresponding one of said plurality of input signals;
    at least one of said first and second nodes forming an output terminal of the linear attenuator.

2. The linear attenuator of claim 1 wherein both of said first and second nodes form output terminals of the linear attenuator.

3. The linear attenuator of claim 1 wherein another one of said first and second nodes besides said at least one of said first and second nodes forming an output terminal of the linear attenuator is coupled to a reference voltage terminal.

4. The linear attenuator of claim 1 wherein each of said plurality of current-steering cells comprises:
    a second transistor having a first current electrode coupled to said second current electrode of said first transistor, a control electrode, and a second current electrode coupled to said first node;
    a first switch having a first terminal coupled to a predetermined voltage terminal, anti a second terminal coupled to said control electrode of said second transistor, said first switch conductive in response to a complement of said corresponding one of said plurality of input signals;
    a second switch having a first terminal coupled to said output terminal of said amplifier, and a second terminal coupled to said control electrode of said second transistor, said second switch active in response to said corresponding one of said plurality of input signals;
    a third transistor having a first current electrode coupled to said second current electrode of said first transistor, a control electrode, and a second current electrode coupled to said second node;
    a third switch having a first terminal coupled to said predetermined voltage terminal, and a second terminal coupled to said control electrode of said third transistor, said third switch active in response to said corresponding one of said plurality of input signals; and
    a fourth switch having a first terminal coupled to said output terminal of said amplifier, and a second terminal coupled to said gate of said third transistor, said fourth switch conductive in response to a complement of said corresponding one of said plurality of input signals.

5. The linear attenuator of claim 4 wherein said first transistor and said second and third transistors of each of said plurality of current-steering cells comprise metal-oxide-semiconductor (MOS) transistors.

6. The linear attenuator of claim 5 wherein said plurality of input signals is characterized as being a plurality of binarily-weighted signals and said second and third transistors of each of said plurality of current-steering cells have gate width-to-length ratios corresponding to a significance of a corresponding one of said plurality of binarily-weighted signals.

7. The linear attenuator of claim 5 wherein said plurality of input signals is characterized as being a plurality of monotonic signals and said second and third transistors of each of said plurality of current-steering cells have substantially equal gate width-to-length ratios.

8. The linear attenuator of claim 5 wherein said first transistor and said second and third transistors of each of said plurality of current-steering cells comprise P-channel metal-oxide-semiconductor (MOS) transistors.

9. The linear attenuator of claim 4 wherein said first transistor and said second and third transistors of each of said plurality of current-steering cells comprise bipolar transistors.

10. A linear attenuator for a current-mode digital-to-analog converter (DAC) or the like, comprising:
    an input node for receiving an input current signal;
    an amplifier having a negative input terminal coupled to said input node, a positive input terminal for receiving a reference voltage, and an output terminal;

a plurality of first transistors each having a first current electrode coupled to said input node, a control electrode coupled to said output terminal of said amplifier, and a second current electrode; and a plurality of current-steering cells each coupled to said second current electrode of a corresponding one of said plurality of first transistors, and steering a current thereinto selectively to first and second output nodes as determined by a corresponding one of a plurality of input signals;

at least one of said first and second output nodes forming an output terminal of the linear attenuator.

11. The linear attenuator of claim 10 wherein both of said first and second output nodes form output terminals of the linear attenuator.

12. The linear attenuator of claim 10 wherein another one of said first and second output nodes besides said at least one of said first and second output nodes forming an output terminal of the linear attenuator is coupled to a reference voltage terminal.

13. The linear attenuator of claim 10 wherein each of said plurality of current-steering cells comprises:

a second transistor having a first current electrode coupled to said second current electrode of said corresponding one of said plurality of first transistors, a control electrode receiving said corresponding one of said plurality of input, and a second current electrode coupled to said first output node;

a first switch having a first terminal coupled to said output terminal of said amplifier, and a second terminal coupled to said control electrode of said second transistor, said first switch conductive in response to said corresponding one of said plurality of input signals;

a third transistor having a first current electrode coupled to said second current electrode of said corresponding one of said plurality of first transistors, a control electrode, and a second current electrode coupled to said second output node; and a third switch having a first terminal coupled to said output terminal of said amplifier, and a second terminal coupled to said control electrode of said third transistor, said third switch active in response to a complement of said corresponding one of said plurality of input signals.

14. The linear attenuator of claim 13 wherein each of said plurality of first transistors and said second and third transistors of each of said plurality of current-steering cells comprise metal-oxide-semiconductor (MOS) transistors.

15. The linear attenuator of claim 14 wherein said plurality of input signals is characterized as being a plurality of binarily-weighted signals and said second and third transistors of each of said plurality of current-steering cells have gate width-to-length ratios corresponding to a significance of a corresponding one of said plurality of binarily-weighted signals.

16. The linear attenuator of claim 14 wherein said plurality of input signals is characterized as being a plurality of monotonic signals and said second and third transistors of each of said plurality of current-steering cells have substantially equal gate width-to-length ratios.

17. The linear attenuator of claim 14 wherein each of said plurality of first transistors and said second and third transistors of each of said plurality of current-steering cells comprise P-channel metal-oxide-semiconductor (MOS) transistors.

18. The linear attenuator of claim 13 wherein each of said plurality of first transistors and said second and third transistors of each of said plurality of current-steering cells comprise bipolar transistors.

19. A digital-to-analog converter (DAC) with a linear attenuator, comprising:

a current DAC having an output terminal for providing an output current; and an amplifier having a negative input terminal coupled to said output terminal of said current DAC, a positive input terminal for receiving a reference voltage, and an output terminal; and the linear attenuator comprising:

a first transistor having a first current electrode coupled to said output terminal of said current DAC, a second current electrode, and a control electrode coupled to said output terminal of said amplifier; and a plurality of current-steering cells each coupled to said second current electrode of said first transistor and receiving a corresponding one of a plurality of input signals, and steering a current thereinto selectively to first and second nodes as determined by said corresponding one of said plurality of input signals;

at least one of said first and second nodes forming an output terminal of the linear attenuator.

20. The DAC of claim 19 further comprising a second linear attenuator, said second linear attenuator comprising:

a first transistor having a first current electrode coupled to said output terminal of said current DAC, a second current electrode, and a control electrode coupled to said output terminal of said amplifier; and a plurality of current-steering cells each coupled to said second current electrode of said first transistor and receiving a corresponding one of a plurality of input signals, and steering a current thereinto selectively to first and second nodes as determined by said corresponding one of said plurality of input signals;

at least one of said first and second nodes forming an output terminal of said second linear attenuator.

* * * * *

UNITED STATES PATENT AND TRADEMARK OFFICE
CERTIFICATE OF CORRECTION

PATENT NO. : 5,442,352
DATED : Aug. 15, 1995
INVENTOR(S) : H. Spence Jackson

It is certified that error appears in the above-indentified patent and that said Letters Patent is hereby corrected as shown below:

Column 8, line 11, after "terminal" delete [anti] and insert --and--.

Signed and Sealed this

Twenty-sixth Day of March, 1996

Attest:

BRUCE LEHMAN

Attesting Officer   Commissioner of Patents and Trademarks